United States Patent
Choi et al.

[11] Patent Number: 6,103,845
[45] Date of Patent: Aug. 15, 2000

[54] CHEMICALLY AMPLIFIED RESIST POLYMERS

[75] Inventors: Sang-jun Choi; Chun-geun Park, both of Kyungki-do; Young-bum Koh, Seoul, all of Rep. of Korea

[73] Assignee: Samsung Electronics Co., Ltd., Kyungki-do, Rep. of Korea

[21] Appl. No.: 08/805,212

[22] Filed: Feb. 27, 1997

[30] Foreign Application Priority Data

Oct. 11, 1996 [KR] Rep. of Korea .................. 96-45396

[51] Int. Cl.$^7$ .................. C08F 222/06; C08F 232/08; C08F 220/18
[52] U.S. Cl. .................. 526/271; 526/281; 526/328
[58] Field of Search .................. 526/271, 281, 526/328

[56] References Cited

U.S. PATENT DOCUMENTS 5,212,043  5/1993  Yamamoto et al. .................. 430/192
5,780,565  7/1998  Clough et al. .................. 526/206

Primary Examiner—Jeffrey Smith
Assistant Examiner—Wu C. Cheng
Attorney, Agent, or Firm—Skjerven, Morrill, MacPherson, Franklin & Friel

[57] ABSTRACT

Copolymers and terpolyers are used in chemically amplified resists. The terpolymers are of the formula:

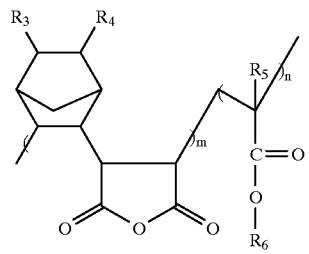

wherein $R_3$ is selected from the group consisting of hydrogen and a $C_1$ to $C_{10}$ aliphatic hydrocarbon, wherein the aliphatic hydrocarbon contains substituents selected from the group consisting of hydrogen, hydroxy, carboxylic acid, carboxylic anhydride, and combinations thereof; $R_4$ is selected from the group consisting of hydrogen and a $C_1$ to $C_{10}$ aliphatic hydrocarbon, wherein the aliphatic hydrocarbon contains substituents selected from the group consisting of hydrogen, hydroxy, carboxylic acid, carboxylic anhydride, and combinations thereof; $R_5$ is selected from the group consisting of hydrogen and methyl; $R_6$ is selected from the group consisting of t-butyl and tetrahydropyranyl; m and n are each integers; and wherein n/(m+n) ranges from about 0.1 to about 0.5.

8 Claims, 3 Drawing Sheets

31 mJ/cm² , 260 nm 31 mJ/cm$^2$, 200 nm

CHEMICALLY AMPLIFIED RESIST POLYMERS

FIELD OF THE INVENTION

The invention relates to polymers used in chemically amplified resist compositions, and resist compositions including such polymers.

BACKGROUND OF THE INVENTION

With increasing integration of semiconductor devices, there may be a heightened need to form finer patterns of subquarter micron capacity in photolithography processes. A photolithography technology has been proposed which may use an ArF eximer laser (193 nm) for devices beyond the 1 giga capacity. This technology may be intended to replace conventional KrF eximer lasers using deep ultraviolet rays (e.g., 248 nm). Accordingly, it may be desirable to develop new chemically amplified resist compositions.

In general, the prerequisites for chemically amplified resist compositions for use with an ArF eximer laser may be as follows: (1) transparency in the range of 193 nm; (2) excellent thermal characteristics, such as for example, high glass transition temperature ($T_g$); (3) excellent adhesion to film materials; (4) excellent resistance against a dry etching process; and (5) capability of being developed using a conventional developer. An example of one polymer which has been developed to possibly possess the above properties is a tetrapolymer, namely poly (IBMA-MMA-tBMA-MAA) which is represented by the general formula:

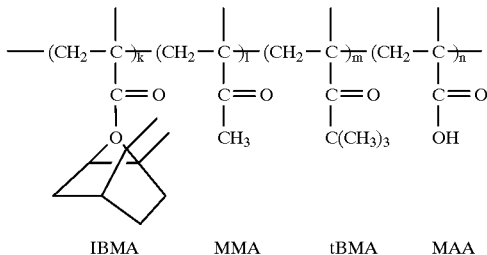

The above tetrapolymer may not be satisfactory. In particular, the tetrapolymer may have a very weak resistance against an etching process and may have weak adhesive properties. Additionally, a special developer may be needed for the development of the tetrapolymer. To potentially address the above problems, a class of cyclopolymers have been proposed which are of the general formula:

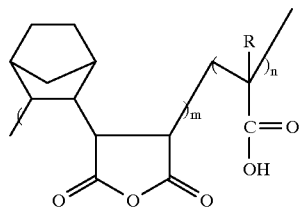

These cyclopolymers, however, also potentially suffer from drawbacks. Specifically, the cyclopolymers may have weak adhesive properties, and as a result lifting may possibly occur at the resist. Moreover, a special developer which may require separate preparation and may have to be employed in a specific concentration range might have to be used with the above cyclopolymers in place of generally accepted developers.

SUMMARY OF THE INVENTION

In view of the above, it is an object of the present invention to provide polymers for use in chemically amplified resists which may be exposed to light using ArF lasers, may have strong resistances to dry etching processes, may possess excellent adhesion to film materials, and may be developed using conventional developers.

It is also an object of the present invention to provide chemically amplified resists containing such polymers.

These and other objects, features, and advantages of the present invention are provided by polymers for use in chemically amplified resists. In one aspect, the invention relates to copolymers for use in chemically amplified resists. The copolymers are of the general formula (I):

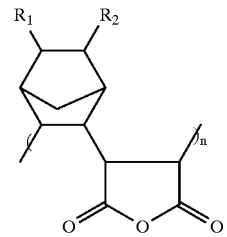

In the above formula (1), $R_1$ is selected from the group consisting of hydrogen and $C_1$ to $C_{10}$ aliphatic hydrocarbons, with the aliphatic hydrocarbons containing substituents selected from the group consisting of hydrogen, hydroxy, carboxylic acid, carboxylic anhydride, and combinations thereof. $R_2$ is selected from the group consisting of hydrogen and $C_1$ to $C_{10}$ aliphatic hydrocarbons, with the aliphatic hydrocarbons containing substituents selected from the group consisting of hydrogen, hydroxy, carboxylic acid, carboxylic anhydride, and combinations thereof; and n represents integers. The copolymers have weight average molecular weights ranging from about 3,000 to about 100,000.

In another aspect, the invention provides terpolymers for use in chemically amplified resists. The terpolymers are represented by the general formula (II):

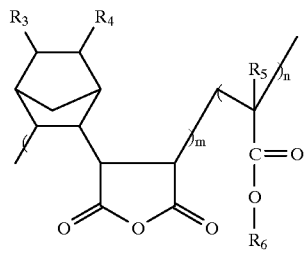

In the above formula (II), $R_3$ is selected from the group consisting of hydrogen and $C_1$ to $C_{10}$ aliphatic hydrocarbons, with the aliphatic hydrocarbons containing substituents selected from the group consisting of hydrogen, hydroxy, carboxylic acid, carboxylic anhydride, and combinations thereof. $R_4$ is selected from the group consisting of hydrogen and $C_1$ to $C_{10}$ aliphatic hydrocarbons, with the aliphatic hydrocarbons containing substituents selected from the group consisting of hydrogen, hydroxy, carboxylic acid, carboxylic anhydride, and combinations thereof. $R_5$ is selected from the group consisting of hydrogen and methyl. $R_6$ is selected from the group consisting of t-butyl and tetrahydropyranyl, and m and n each represent integers. The ratios n/(m+n) range from about 0.1 to about 0.5.

In yet another aspect, the invention provides resist compositions which may include the copolymers and terpolymers described above.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE PREFERRED EMBODIMENTS

Figure 1:
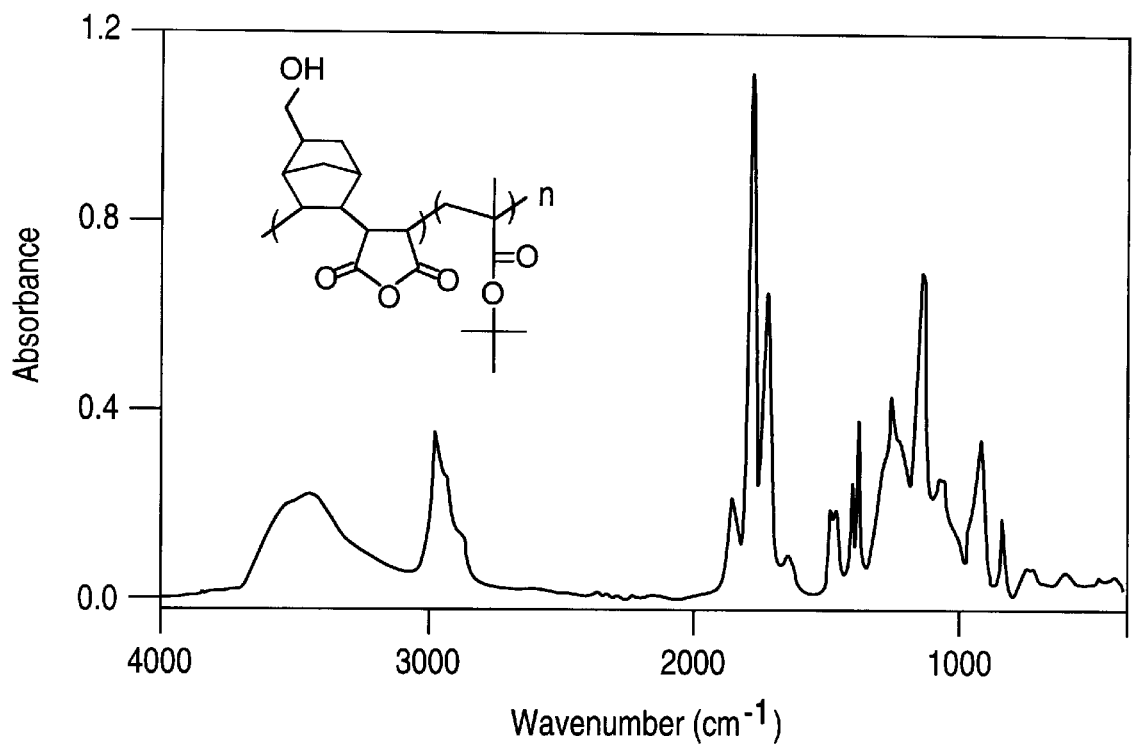
FIG. 1 represents a Fourier Transform Infrared Radiation (FTIR) spectrum of a terpolymer according to the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

The invention relates to copolymers for use in chemically amplified resists. The copolymers are represented by the general formula (I):

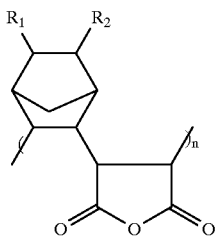

In the formula (I), $R_1$ is selected from the group consisting of hydrogen and $C_1$ to $C_{10}$ aliphatic hydrocarbons, with the aliphatic hydrocarbons containing substituents selected from the group consisting of hydrogen, hydroxy, carboxylic acid, carboxylic anhydride, and combinations thereof. $R_2$ is selected from the group consisting of hydrogen and $C_1$ to $C_{10}$ aliphatic hydrocarbons, with the aliphatic hydrocarbons containing substituents selected from the group consisting of hydrogen, hydroxy, carboxylic acid, carboxylic anhydride, and combinations thereof; and n is an integer. The weight average molecular weights of the copolymers range from about 3,000 to about 100,000.

Referring to formula (I), in one embodiment, $R_1$ is hydrogen and $R_2$ is a $C_1$ to $C_{10}$ aliphatic hydrocarbon containing a hydroxy group. In a second embodiment, $R_1$ is hydrogen and $R_2$ is an aliphatic hydrocarbon of the formula —$CH_2OH$. In a third embodiment, $R_1$ is a $C_1$ to $C_{10}$ aliphatic hydrocarbon containing a hydroxy group and $R_2$ is a $C_1$ to $C_{10}$ aliphatic hydrocarbon containing a hydroxy group, wherein $R_1$ and $R_2$ may be the same or different. In a fourth embodiment, $R_1$ is a $C_1$ to $C_{10}$ aliphatic hydrocarbon containing a carboxylic acid group and $R_2$ is a $C_1$ to $C_{10}$ aliphatic hydrocarbon containing a carboxylic acid group, wherein $R_1$ and $R_2$ may be the same or different. In a fifth embodiment, $R_1$ is a $C_1$ to $C_{10}$ aliphatic hydrocarbon containing a carboxylic anhydride group and $R_2$ is a $C_1$ to $C_{10}$ aliphatic hydrocarbon containing a carboxylic anhydride group, wherein $R_1$ and $R_2$ may be the same or different.

The invention also relates to terpolymers for use in chemically amplified resists. The terpolymers are represented by the general formula (II):

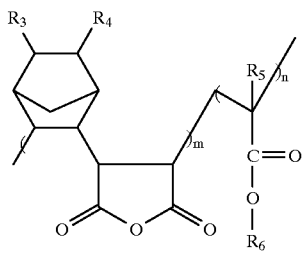

In formula (II), $R_3$ is selected from the group consisting of hydrogen and $C_1$ to $C_{10}$ aliphatic hydrocarbons, with the aliphatic hydrocarbons containing substituents selected from the group consisting of hydrogen, hydroxy, carboxylic acid, carboxylic anhydride, and combinations thereof. $R_4$ is selected from the group consisting of hydrogen and $C_1$ to $C_{10}$ aliphatic hydrocarbons, with the aliphatic hydrocarbons containing substituents selected from the group consisting of hydrogen, hydroxy, carboxylic acid, carboxylic anhydride, and combinations thereof. $R_5$ is selected from the group consisting of hydrogen and methyl. $R_6$ is selected from the group consisting of t-butyl and tetrahydropyranyl, and m and n each represents integers. The ratios n/(m+n) range from about 0.1 to about 0.5. Preferably, the weight average molecular weights of the terpolymers range from about 3,000 to about 100,000, and more preferably from about 5,000 to about 30,000.

Referring to formula (II), in one embodiment, $R_3$ is hydrogen and $R_4$ is a $C_1$ to $C_{10}$ aliphatic hydrocarbon containing a hydroxy group. In a second embodiment, $R_3$ is hydrogen and $R_4$ is an aliphatic hydrocarbon of the formula —$CH_2OH$. In a third embodiment, $R_3$ is a $C_1$ to $C_{10}$ aliphatic hydrocarbon containing a hydroxy group and $R_4$ is a $C_1$ to $C_{10}$ aliphatic hydrocarbon containing a hydroxy group, wherein $R_3$ and $R_4$ may be the same or different. In a fourth embodiment, $R_3$ is a $C_1$ to $C_{10}$ aliphatic hydrocarbon containing a carboxylic acid group and $R_4$ is a $C_1$ to $C_{10}$ aliphatic hydrocarbon containing a carboxylic acid group, wherein $R_3$ and $R_4$ may be the same or different. In a fifth embodiment, $R_3$ is a $C_1$ to $C_{10}$ aliphatic hydrocarbon containing a carboxylic anhydride group and $R_4$ is a $C_1$ to $C_{10}$ aliphatic hydrocarbon containing a carboxylic anhydride group, wherein $R_3$ and $R_4$ may be the same or different.

The invention also relates to resist compositions which may include the copolymers and terpolymers described herein and photoacid generators. The photoacid generators which may be preferably used include, but are not limited to, triarylsulfonium salt, diaryliodonium salt, sulfonates, and mixtures thereof. The resist compositions may include various amounts of polymers and photoacid generators. For example, in resist compositions containing terpolymers, photoacid generators may be present in amounts ranging from about 1 to about 20 weight percent based on the weights of the terpolymers. Preferably, the weight average molecular weights of terpolymers used in the resist compositions range from about 5,000 to about 20,000.

Although Applicants do not wish to be bound by any one theory, it is believed that an exposure mechanism of a polymer provided by the invention may be illustrated by the following reaction:

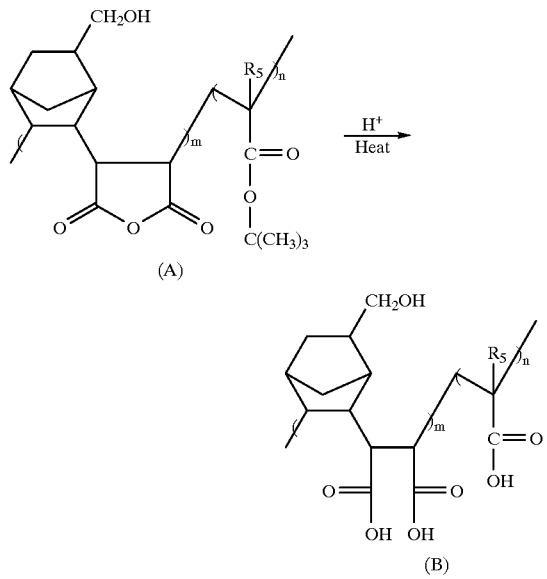

In the above mechanism, the polymer (A) of pre-exposure is not very soluble in a developer, while the polymer (B) formed as a result of postexposure is highly soluble in a developer.

Resist compositions using the copolymers and terpolymers of the invention are highly advantageous. The resist compositions may have excellent resistance to dry etching processes. The resist compositions also may possess excellent adhesion to film materials. Additionally, conventional developers, e.g., a 2.38 wt % TMAH developer, may be used with the resist compositions.

The following examples are to be construed as illustrative of the present invention, and not as a limitation thereon.

EXAMPLE 1

Synthesis of Copolymer

The synthesis reaction of a copolymer according to this embodiment can be represented by the following formula:

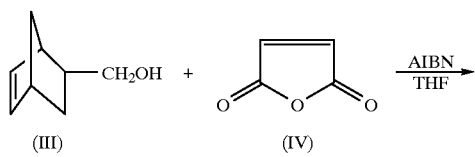

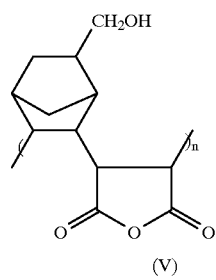

In this synthesis, 12.4 g (0.1 mol) of 5-norbornene-2-methanol (III) and 9.8 g (0.1 mol) of maleic anhydride (IV) were dissolved in 100 ml of tetrahydrofuran (THF) together with 1.31 g (0.008 mol) of 2.2'-azobisisobutyronitrile (AIBN). The reactants were purged with nitrogen ($N_2$) gas at a temperature of 65–70° C. for about 24 hours so as to form the reaction product.

After polymerization, the reaction product was precipitated in n-hexane and the precipitates were dried in a vacuum oven maintained at 50° C. for about 24 hours to obtain copolymer (V) product (yield: 70%). The weight-average molecular weight of the obtained reaction product was 4,500 and the polydispersity (weight-average molecular weight/number-average molecular weight) was 2.5.

The result of the FTIR spectral analysis for the thus-obtained copolymer (V) product was as follows:

FTIR (KBr): 3400 cm$^{-1}$ (—OH), 1782 cm$^{-1}$ (C=O).

EXAMPLE 2

Synthesis of Copolymer

The synthesis reaction of a copolymer according to this embodiment can be represented by the following formula:

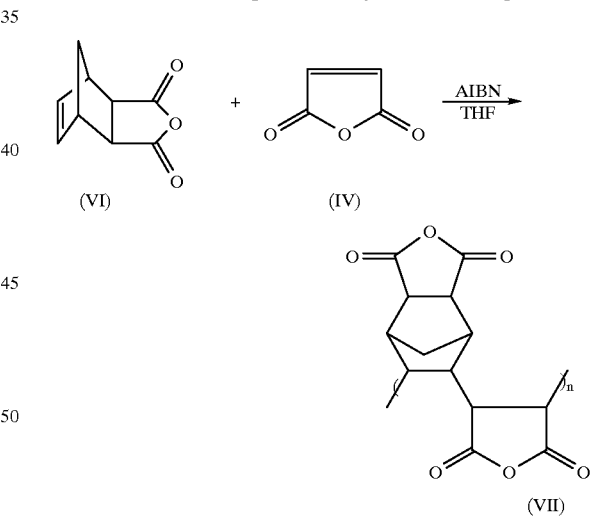

In this embodiment, 16.4 g (0.1 mol) of 5-norbornene-2,3-dicarboxylic acid (VI) and 9.8 g (0.1 mol) or maleic anhydride (IV) were dissolved in 120 ml of tetrahydrofuran (THF), and 1.31 g (0.008 mol) of AIBN was added thereto. The product was polymerized under the nitrogen ($N_2$) gas ambience at 65–70° C. for about 24 hours.

After polymerization, the reaction product was precipitated in n-hexane and the precipitates were dried in a vacuum oven maintained at 50° C. for about 24 hours to obtain copolymer (VII) product (yield: 70%). The weight-average molecular weight of the obtained reaction product was 5,500 and the polydispersity was 2.4.

EXAMPLE 3

Synthesis of Terpolymer

The synthesis reaction of a terpolymer according to this embodiment can be represented by the following formula:

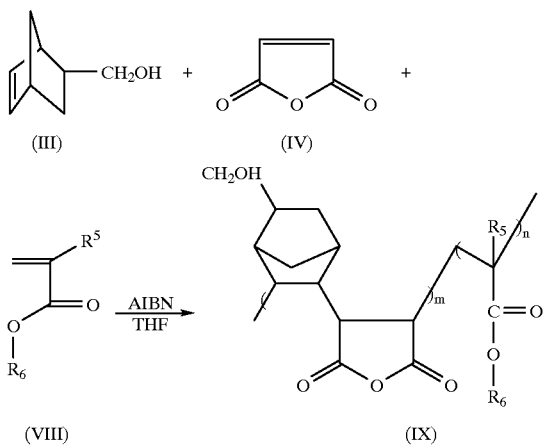

where $R_5$ is hydrogen or methyl, and $R_6$ is t-butyl or tetrahydropranyl group.

A. Synthesis of Terpolymer Wherein $R_6$ is a t-butyl Group 12.4 g (0.1 mol) of 5-norbornene-2-methanol (III), 9.8 g (0.1 mol) of maleic anhydride (IV), and 14 g (0.1 mol) of t-butyl methacrylate (VII) were dissolved in 150 ml of tetrahydrofurane (THF), and 1.64 g (0.01 mol) of AIBN was added thereto. The product was polymerized at a temperature of 65–70° C. for about 24 hours.

After polymerization, the reaction product was precipitated in n-hexane and the precipitates were dried in a vacuum oven maintained at 50° C. for about 24 hours to obtain terpolymer (IX) product (yield: 70%). The weight-average molecular weight of the obtained reaction product was 6,000, the polydispersity was 2.4, and the glass transition temperature ($T_g$) was 135° C.

FIG. 1 represents a Fourier Transform Infrared Radiation (FTIR) spectrum of the terpolymer (IX) obtained in the above manner and the result of the analysis was as follows.

IR (KBr): 3400 cm$^{-1}$ (—OH), 1784 cm$^{-1}$ (C=O), 1722 cm$^{-1}$ (C=O).

B. Synthesis of Terpolymer Wherein $R_6$ is a Tetrahydropyranyl Group

Terpolymer (IX) was obtained in a manner similar to that described in case A, except that 17 g (0.1 mol) of tetrahydropyranyl methacrylate was used instead of t-butyl methacrylate. The yield of the terpolymer (IX) was 70%. The weight-average molecular weight of the obtained reaction product was 5,500, and the polydispersity was 2.3.

The result of the FTIR spectral analysis of the thus-obtained terpolymer (IX) product was as follows:

IR (KBr): 3400 cm$^{-1}$ (—OH), 1784 cm$^{-1}$ (C=O), 1723 cm$^{-1}$ (C=O).

EXAMPLE 4

Synthesis of a Resist Composition 1 g of the terpolymer (IX) obtained from Example 3 was dissolved in 7 g of propylene glycol monomethyl ether acetate (PGMEA). 0.02 g of triphenyl sulfonium triflate was added thereto. The mixture was stirred thoroughly. Then, the resist composition was obtained by filtering the mixture using a 0.2 μm microfilter. The obtained resist composition was applied to a wafer to form a coating film of about 0.5 μm on the wafer.

The wafer having the coating film was baked at about 140° C. for about 90 seconds, exposed to light using a KrF eximer laser having a numeric aperture of 0.45 and then baked again at about 140° C. for about 90 seconds. Thereafter, the resultant was developed for about 60 seconds using about 2.38 wt % of tetramethyl ammonium hydroxide (TMAH) solution.

Figure 2A:
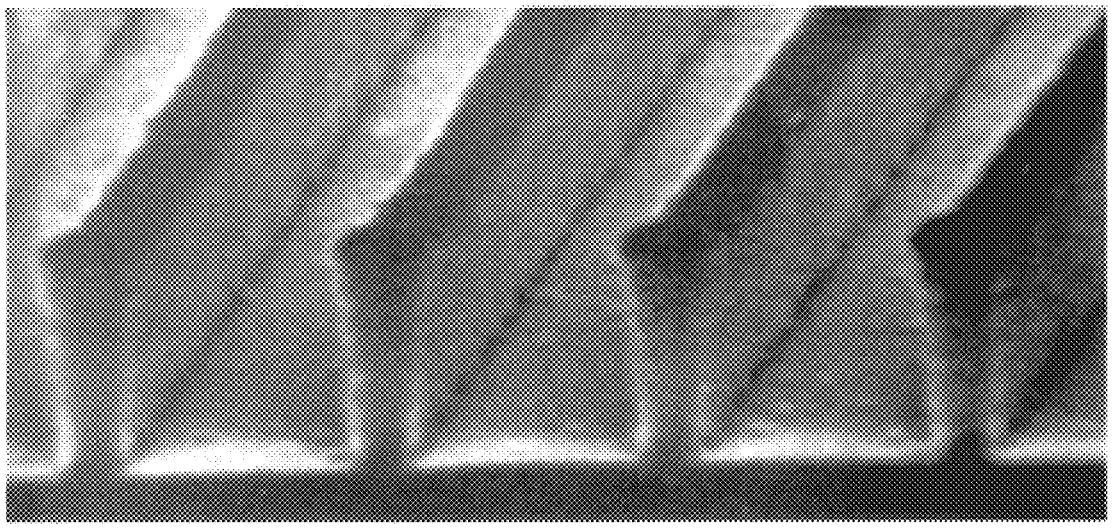
FIG. 2 represents a sectional view of forming a photoresist pattern using a resist composition according to the present invention.
Figure 2B:
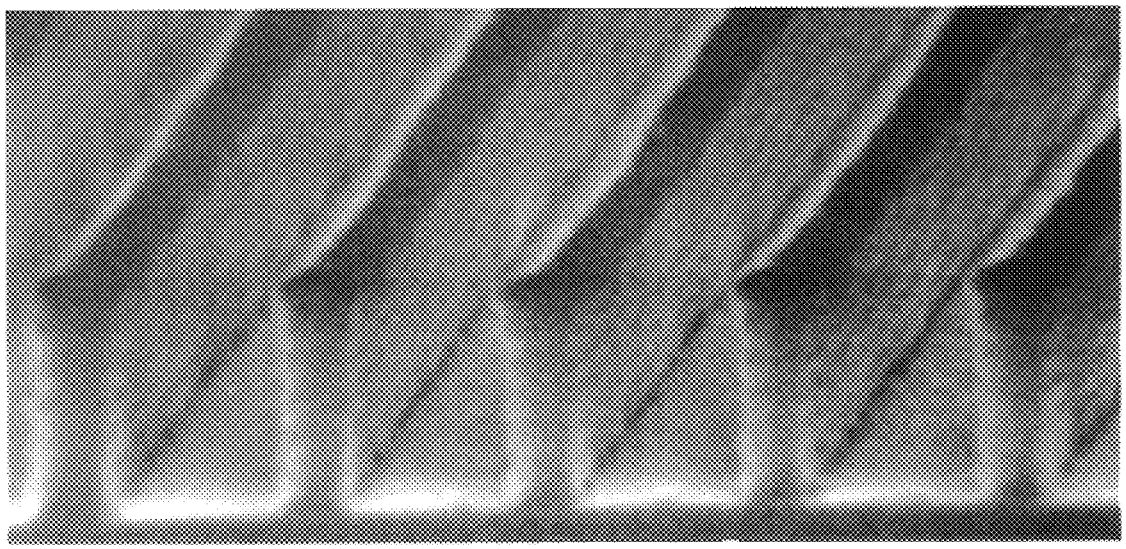

FIGS. 2(a) and (b) are SEM photographs of the photoresist pattern formed by exposing the film of resist composition using an exposure source having an energy of 31 mj/cm$^2$ and a wavelength of 260 nm, and an exposure source having an energy of 31 mj/cm$^2$ and a wavelength of 200 nm, respectively. The film was then developed. As can be seen in FIG. 2, excellent cross-sectional profiles were obtained at the respective wavelength bands.

Figure 3:
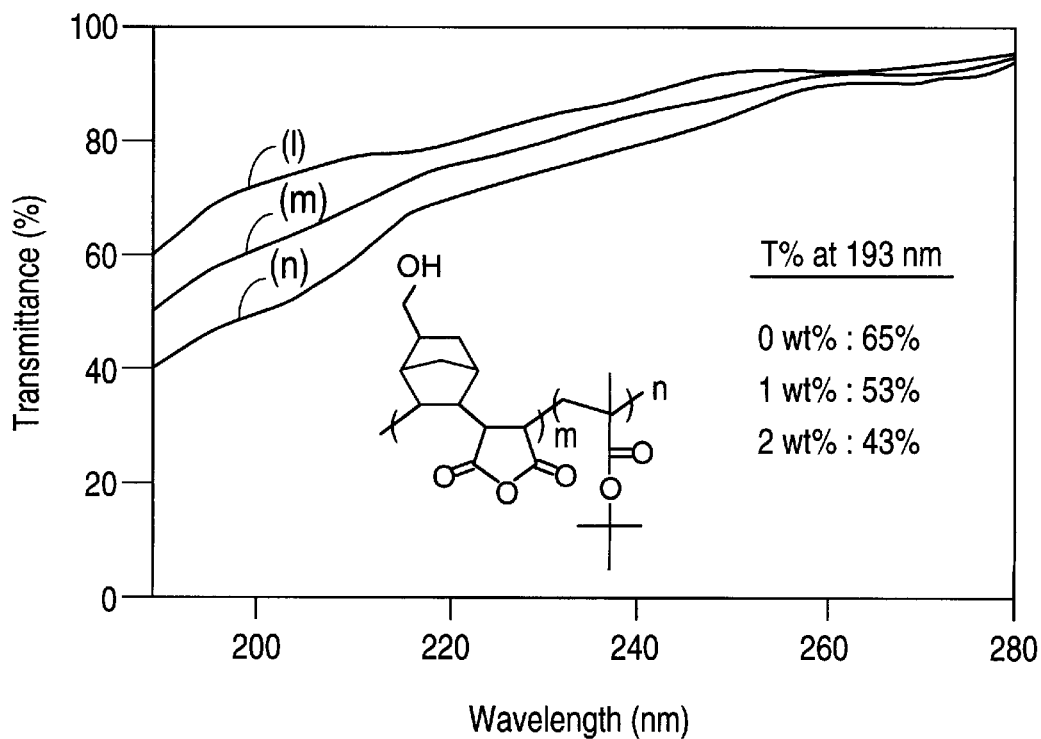
FIG. 3 is a graph illustrating the measured transmittance depending on the respective wavelengths of an ultraviolet (UV) spectrum for a resist composition according to the present invention.

FIG. 3 is a graph illustrating the measured transmittance versus the wavelengths of an ultraviolet (UV) spectrum for the resist composition according to the present invention. In FIG. 3, curve (1) indicates the transmittance of a pure resist composition to which the PAG is not added, curve (m) indicates the transmittance of a resist composition to which the PAG is added at a level of 1 wt %, and curve (n) indicates the transmittance of a resist composition to which the PAG is added at a level of 2 wt %. As can be seen in FIG. 3, at a wavelength of 193 nm, the measured transmittances of (1) the pure resist composition, (2) the resist composition 10 with 1 wt % PAG added thereto, and (3) the resist composition with 2 wt % PAG added thereto were 65%, 53% and 43%, respectively.

In the drawings, specification, and examples, there have been disclosed typical preferred embodiments of the invention and, although specific terms are employed, they are used in a generic and descriptive sense only and not for purposes of limitation, the scope of the invention being set forth in the following claims.

That which is claimed:

1. A terpolymer for use in a chemically amplified resist, said terpolymer having the formula:

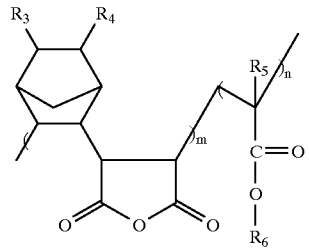

wherein $R_3$ is selected from the group consisting of hydrogen and a $C_1$ to $C_{10}$ aliphatic hydrocarbon, wherein said aliphatic hydrocarbon contains substituents selected from the group consisting of hydrogen, hydroxy, carboxylic acid, carboxylic anhydride, and combinations thereof;

$R_4$ is selected from the group consisting of hydrogen and a $C_1$ to $C_{10}$ aliphatic hydrocarbon, wherein said aliphatic hydrocarbon contains substituents selected from the group consisting of hydrogen, hydroxy, carboxylic acid, carboxylic anhydride, and combinations thereof;

$R_5$ is selected from the group consisting of hydrogen and methyl;

$R_6$ is selected from the group consisting of t-butyl and tetrahydropyranyl;

m and n are each integers; and wherein n/(m+n) ranges from about 0.1 to about 0.5.

2. A terpolymer according to claim 1, wherein said terpolymer has a weight average molecular weight of from about 3,000 to about 100,000.

3. A terpolymer according to claim 1, wherein $R_3$ is hydrogen; and $R_4$ is an aliphatic hydrocarbon containing a hydroxy group.

4. A terpolymer according to claim 1, wherein $R_3$ is hydrogen and $R_4$ is an aliphatic hydrocarbon of the formula —CH$_2$OH.

5. A terpolymer according to claim 1, wherein $R_3$ is a $C_1$ to $C_{10}$ aliphatic hydrocarbon containing a hydroxy group and $R_4$ is a $C_1$ to $C_{10}$ aliphatic hydrocarbon containing a hydroxy group.

6. A terpolymer according to claim 1, wherein $R_3$ is a $C_1$ to $C_{10}$ aliphatic hydrocarbon containing a carboxylic acid group and $R_4$ is a $C_1$ to $C_{10}$ aliphatic hydrocarbon containing a carboxylic acid group.

7. A terpolymer according to claim 1, wherein $R_3$ is a $C_1$ to $C_{10}$ aliphatic hydrocarbon containing a carboxylic anhydride group and $R_4$ is a $C_1$ to $C_{10}$ aliphatic hydrocarbon containing a carboxylic anhydride group.

8. A terpolymer according to claim 1, wherein said terpolymer has a weight average molecular weight ranging from about 5,000 to about 30,000.

* * * * *